(12) United States Patent
Steinbach et al.

(10) Patent No.: US 6,490,005 B1
(45) Date of Patent: Dec. 3, 2002

(54) VIDEO ANALOG-TO-DIGITAL CONVERTER

(75) Inventors: Günter W. Steinbach; James Chow, both of Palo Alto; Kenny Wen, San Jose; Khin Lay, Santa Clara, all of CA (US)

(73) Assignee: STMicroelectronics, Inc., Carrollton, TX (US)

( * ) Notice: Subject to any disclaimer, the term of this patent is extended or adjusted under 35 U.S.C. 154(b) by 194 days.

(21) Appl. No.: 09/607,493

(22) Filed: Jun. 30, 2000

(51) Int. Cl.[7] .................................. H03M 1/12
(52) U.S. Cl. ........................ 348/572; 348/574
(58) Field of Search ................. 348/572, 573, 348/574; 341/155; H04N 5/14; H03M 1/12

(56) References Cited

U.S. PATENT DOCUMENTS 5,696,510 A * 12/1997 Paillardet et al. ........... 348/572

OTHER PUBLICATIONS

M. Loinaz, et al., "FA 11.1: A 200mW 3.3W 3.3V CMOS Color Camera IC Producing 352x288 24b Video at 30 Frames/s", IEEE 1998, pp. 11.1–1.9.

M. Loinaz, et al., "A 200–mW, 3.3–V., CMOS color camera IC Producing 352 x 288 24–b Video at 30 Frames/s". IEEE Journal of Solid–State Circuits, vol. 33, No. 12, Dec. 1998, pp. 2092–2103.

* cited by examiner

Primary Examiner—Sherrie Hsia
(74) Attorney, Agent, or Firm—Stephen Bongini; Lisa K. Jorgenson

(57) ABSTRACT

An analog-to-digital converter (ADC) (112) for sampling high speed video signals includes Pre-amplifiers (502, 504, 506) electrically coupled to Post-amplifiers (508, 510, 512) that are electrically coupled to output latches (514, 517, 519, 521, 523, 525, and 527). A sampling clock signal (116) clocks the output latches (514, 517, 519, 521, 523, 525, and 527) to sample an input analog electronic signal to provide a digital representation thereof. The ADC (112) includes an auto-zeroing function to cancel bias voltages at the Post-amplifiers (508, 510, 512) during a video signal horizontal blanking time period. The ADC (112) includes a bit dithering function by alternating sets of reference voltages into the Pre-amplifiers (502, 504, 506) increasing bit resolution. The ADC (112) includes wired interconnect interpolation between the Pre-amplifiers (502, 504, 506) and Post-amplifiers (508, 510, 512) and between the Post-amplifiers (508, 510, 512) and the output latches (514, 517, 519, 521, 523, 525, and 527).

19 Claims, 7 Drawing Sheets

VIDEO ANALOG-TO-DIGITAL CONVERTER

BACKGROUND OF THE INVENTION

1. Field of the Invention

This invention relates in general to analog-to-digital converter systems, and more particularly to a high speed analog-to-digital converter suitable for processing video signals to convert the video signals to a digital representation thereof.

2. Description of Related Art

A variety of electronic devices, such as computers, monitors, flat panel displays, wireless communication devices, to name just a few, utilize high speed electronic signals, e.g., clock signals, video signals, spread spectrum and digital wireless communication signals, etc. A predominant trend in electronic devices is the use of digital signals. As it is well known to those of ordinary skill in the art, there are many advantages to representing electronic signals in digital signal form in many such electronic devices.

An Analog-to-Digital converter (ADC) is typically utilized to sample an analog electronic signal at a point in time and to convert the sampled electronic signal to a digital representation thereof. The ADC, in; one common configuration, typically includes a resistive ladder network electrically coupled to a plurality of comparators that are respectively referenced to a plurality of reference voltages. The ADC compares the voltage amplitude of an input signal to the plurality of reference voltages and provides an output signal that is a digital representation of the input signal at a point in time.

Regrettably, conventional ADC implementations have been typically designed for electronic signaling that is much slower than capable of handling the higher speed video signaling. For high speed signaling applications, such as video signaling, ADCs have unique requirements that in the past have not been met by conventional ADC technology.

First of all, ADCs are coupled to input signals via capacitive networks that tend to build up bias voltages over time. These bias offset voltages defeat the accuracy of the ADC comparators. To counter such offset voltages, prior art systems have utilized auto-zeroing circuits that operate within the cycle of a clock to the ADC. This presented no real problem for slower clock systems because there was plenty of time within the cycle to perform functions in the ADC. Unfortunately, this auto-zeroing function consumes a significant portion of the clock cycle in high speed signaling systems and takes away from the operation of the ADC functions during that significant portion of the clock cycle.

Secondly, there is a constant need for higher precision in the final digital representation that is output from the ADC that is sampling an analog signal. Every additional bit line multiplies the number of comparators by a factor of 2. This in turn increases the expense and complexity of the ADC circuits. Additionally, this increases the power consumption of the ADC circuits thereby decreasing the potential speed of driving these circuits at a given power supply. For very high speed circuits it is imperative to drive the ADC at a maximum speed to track the very high speed signals in video signaling.

Dithering has been used in ADCs for slower signaling to allow sharing of some of the circuitry while providing an additional bit of output from the slower ADC. This dithering of the output bits of the ADC has typically been done to improve the linearity of the outputs of the ADC, and not to increase the resolution of the output of the ADC.

Another technique used to enhance the linearity is by utilizing interpolation between output bits by adding, for example, an interpolated output bit between two normal output bits thereby increasing the total number of output bits available from the ADC. This interpolation has traditionally required significant additional passive and/or active elements to be added to the outputs of the ADC to enhance the number of outputs and thereby the linearity of the output of the ADC.

Although dithering and interpolation have been used in slower ADC circuits to enhance the linearity of an output signal from the ADC, there is still a significant need to provide enhanced resolution at the output of a high speed ADC, such as for processing video signaling.

Thus, there is a need to overcome the disadvantages of the prior art as discussed above, and in particular to improve the quality of conversion of the analog electronic signal to a digital representation thereof.

DETAILED DESCRIPTION OF THE PREFERRED EMBODIMENTS

Figure 1:
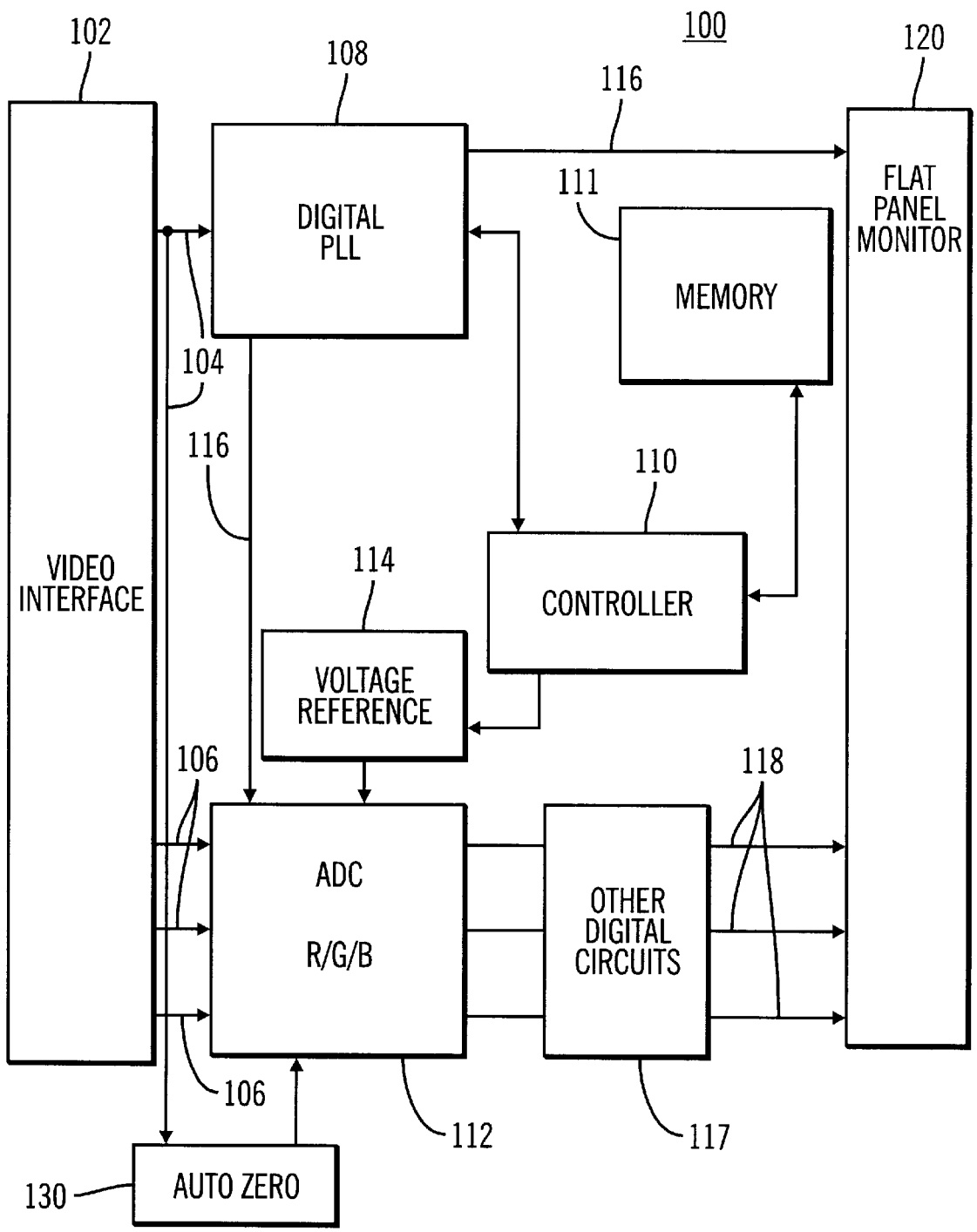
FIG. 1 a functional block diagram of an exemplary video signaling system, in accordance with a preferred embodiment of the present invention.

Referring to FIG. 1, an exemplary application of a preferred embodiment of the present invention operates in a flat panel display monitor system 100. A graphics card inside a PC typically contains a graphics accelerator IC and a frame buffer. The graphics accelerator renders a frame of data in memory then converts to analog and transmits to an LCD monitor via an analog VGA cable. In addition to the analog data, horizontal and vertical synchronization signals are transmitted. This video signal is delivered via the cable to a video interface 102 of a flat panel monitor system 100 that includes a preferred embodiment of the present invention, as will be discussed below.

Flat panel monitors based on liquid crystal display (LCD) technology are rapidly deploying into the personal computer display marketplace. Flat panel monitors offer performance advantages over conventional CRT monitors, but the PC industry faces challenges in seamlessly integrating them into the desktop PC environment. In addition to size, weight and power advantages flat panel monitors improve image acuity. Flat panel monitors are digital devices, and have the benefits of digital technology in the panel electronics, compared to analog CRT technology. Each pixel element in a flat panel monitor is micro-lithographically defined, which results in precisely defined pixel areas, unlike the fuzzy overlap of phosphor dots and the electron beam in a CRT.

Most LCD modules used in flat panel monitor applications require digital interfaces. These digital interfaces create difficulties in connecting to the analog graphics output of today's personal computer. Expensive and complex analog circuit boards have been used to convert the analog signals from the PC into the digital signals required by the flat panel. In the past, users have been unable to realize all of the image quality benefits of flat panel monitors because these boards have not been able to perfectly reproduce the digital source data, as it existed in the PC.

These interface challenges and user expectations set the flat panel monitor electronics requirement. Compatibility with the PC environment first starts by properly reconstructing the clock, as described in co-pending U.S. patent application Ser. No. 09/534,932, entitled "Digital Phase Lock Loop", and co-pending U.S. patent application Ser. No. 09/535,049, entitled "System for High Precision Signal Phase Difference Measurement", both identified U.S. Patent Applications being commonly owned by the assignee of the present invention, and the full teachings of both identified U.S. Patent Applications being hereby incorporated by reference. Then, compatibility is achieved by successfully converting the analog data from the PC video signal into a digital format in the flat panel monitor, as will be discussed below.

The synchronization signals include, a regenerate pixel clock signal 116. The new pixel clock is used by the analog to digital converters (ADC) 112 to capture the analog input data signal in digital form. The digital signal reconstruction process consists of three steps. Sync and video timing information in the video signal present at an input 104 in the video interface 102 is first used to determine the video mode of the graphics card driving the analog cable. The mode detection circuit then programs the clock recovery circuit, the digital phase lock loop (DPLL) 108, to regenerate the pixel clock signal 116. The Sync signal out of input 104 also goes to the Auto Zero block 130 to generate the auto zero activate signals for ADC 112. Finally the regenerated pixel clock is provided at an output 116 of the DPLL 108. This pixel clock drives the flat panel monitor 120. The clock output 116 also drives the sampling clock input of the analog to digital converters (ADC) 112 which transform the input analog red, green, and blue (RGB) signals 106 to digital format at outputs of the ADC 112. After being processed through other digital circuits 117 the (RGB) digital video signals, at output lines 118, are electrically coupled to the flat panel monitor 120.

Figure 2A:
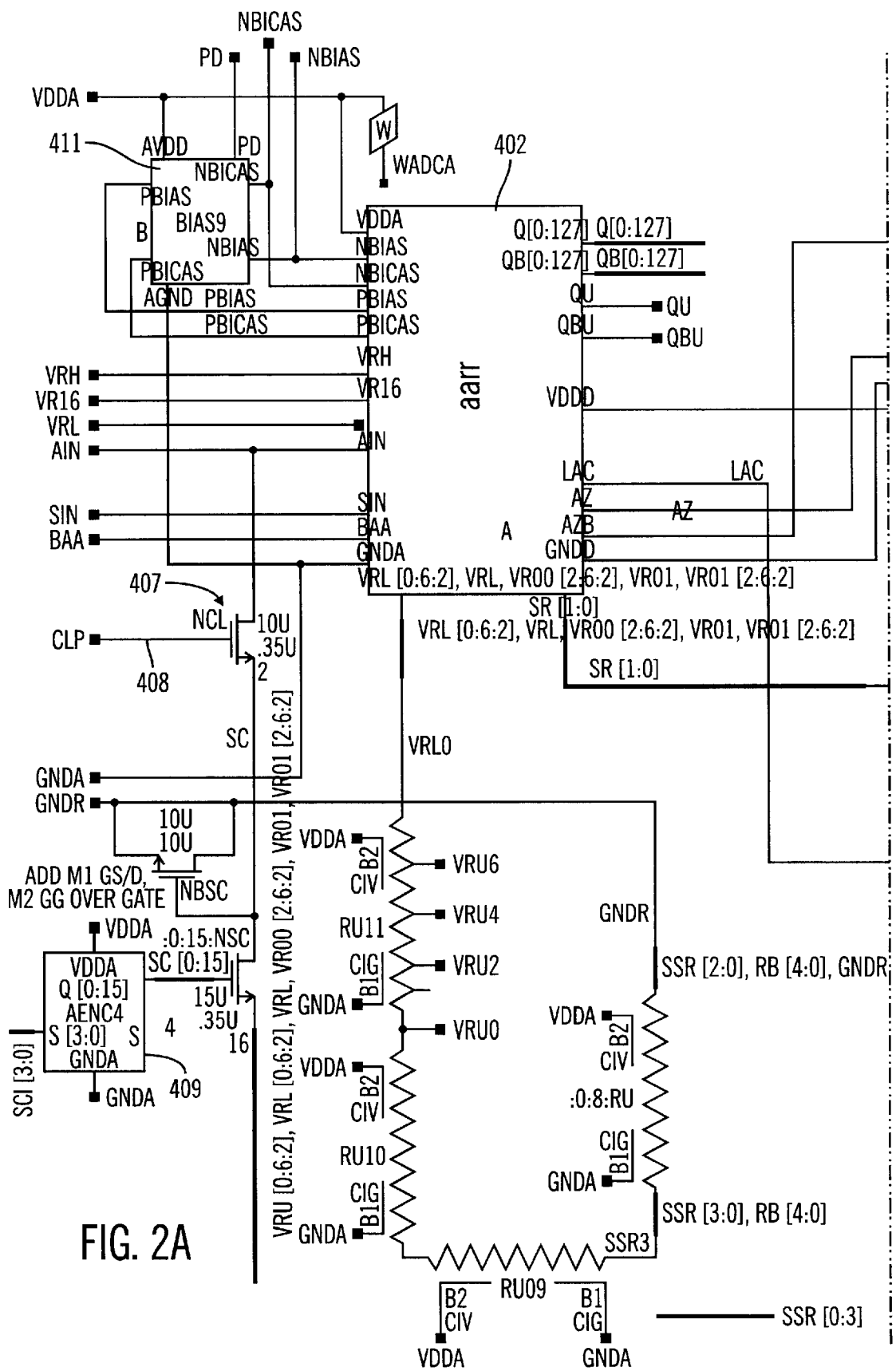
FIGS. 2, 3, and 4, are electrical schematic diagrams of an exemplary analog-to-digital converter as shown in FIG. 1, in accordance with a preferred embodiment of the present invention.
Figure 2B:
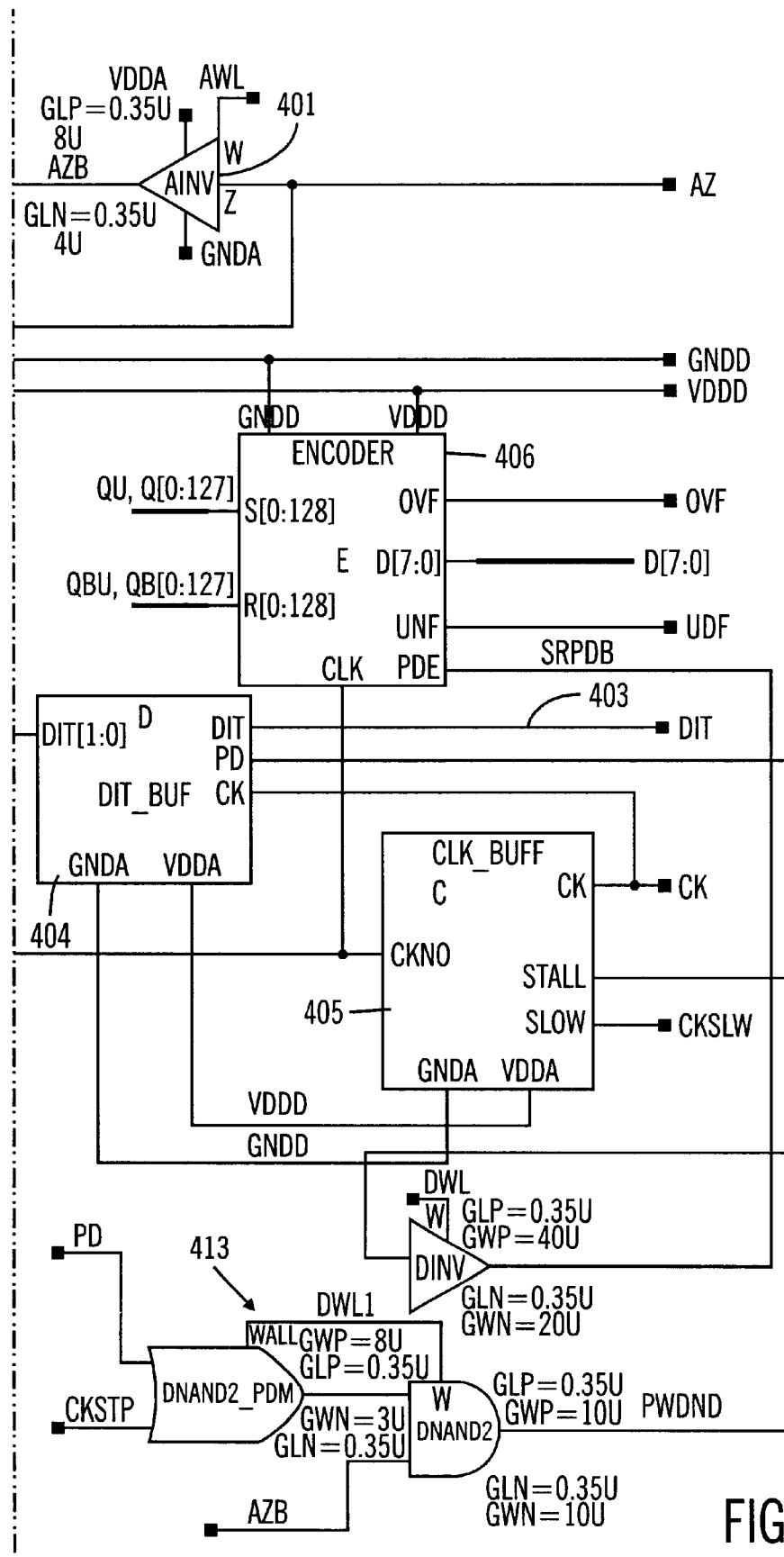
Figure 3A:
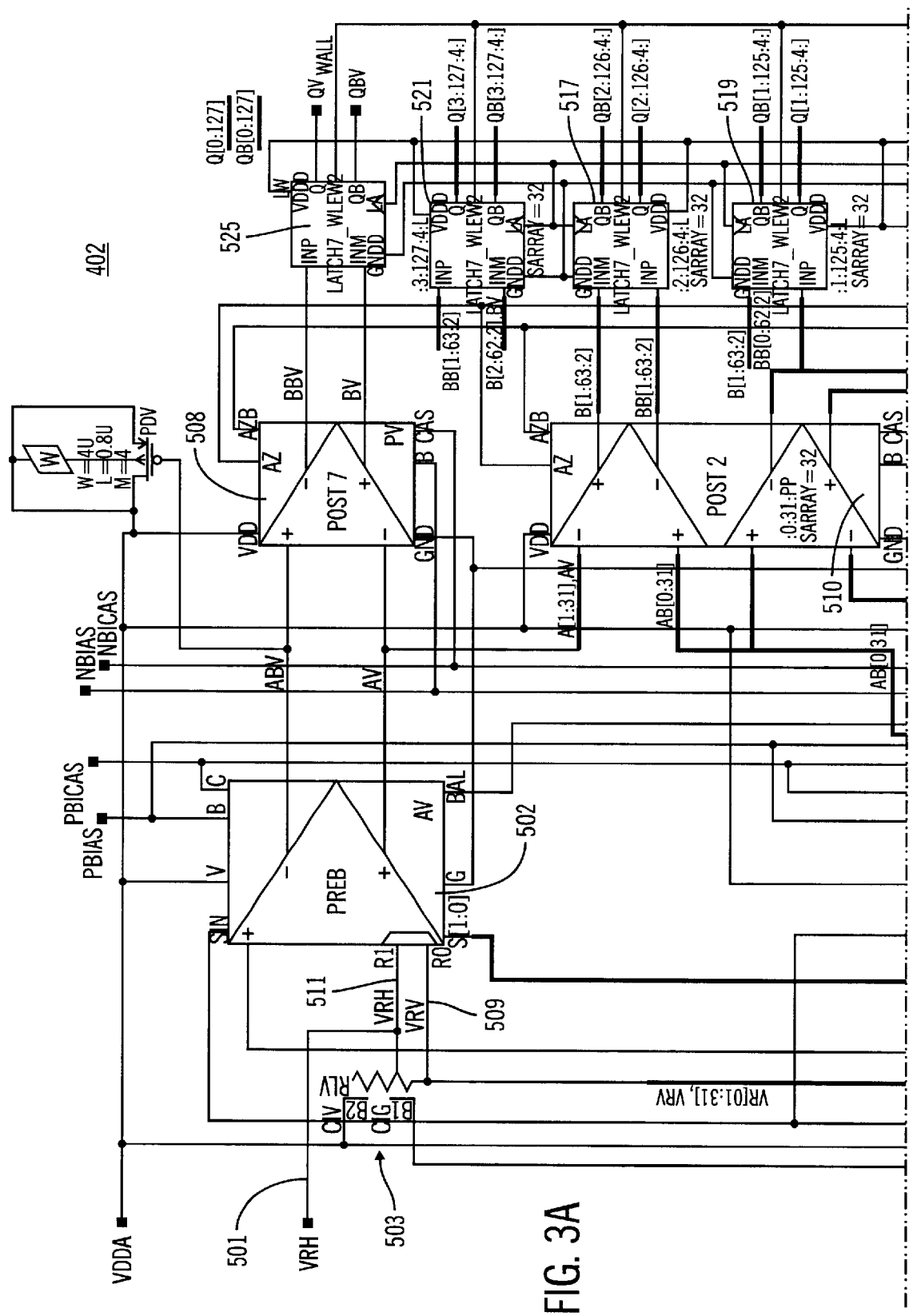
Figure 3B:
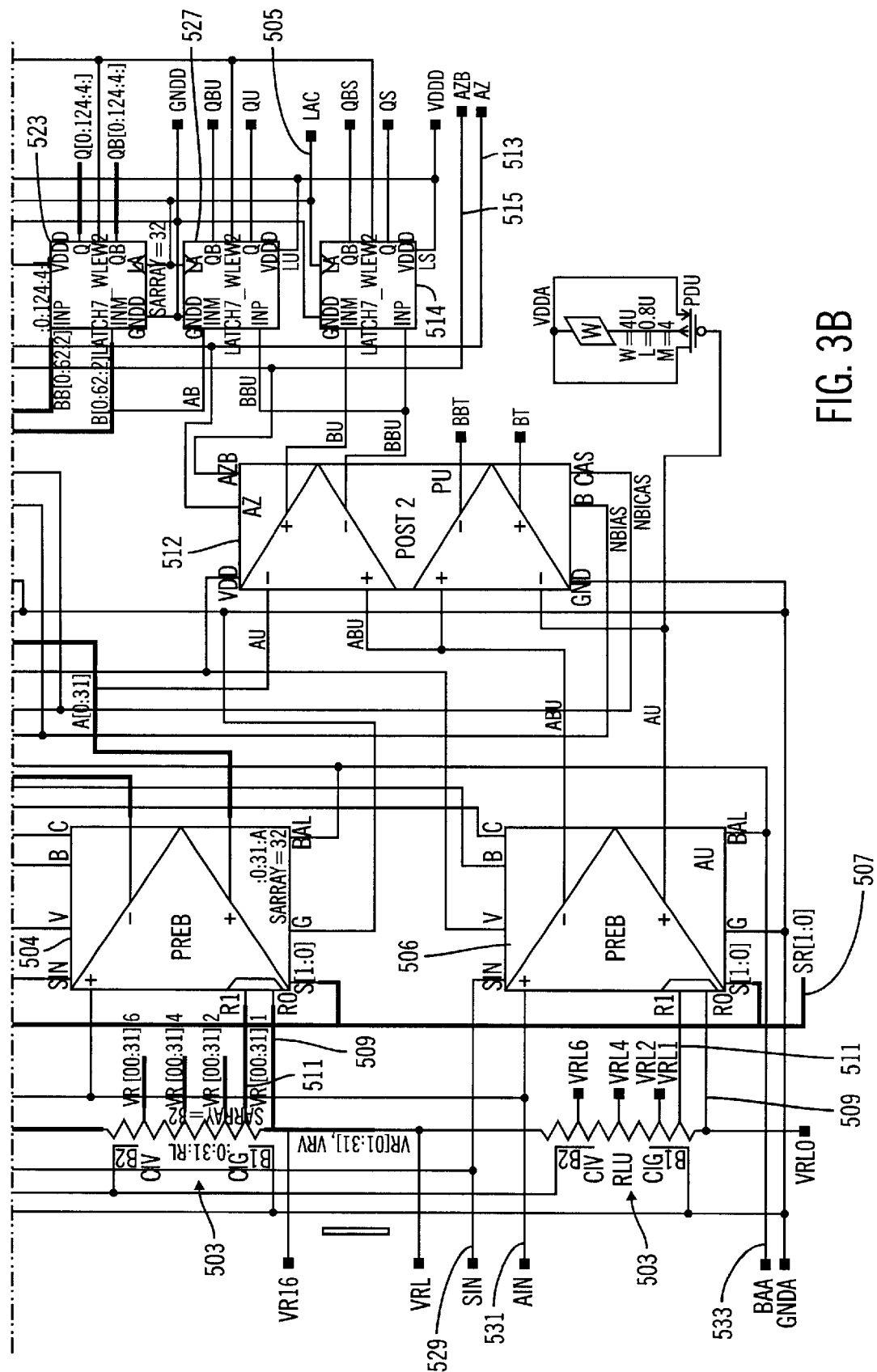

The Auto Zero block 130 detects Sync signal, in this example, which is within the blanking signal period of the video signal from input 104. The Sync signal 104 normally is within the video signal blanking signal period and is used in this example to represent the occurrence of the blanking signal period. Any other signal that would likewise be representative of the blanking signal time period would also be suitable for use as input to the Auto Zero circuit block 130, as may be obvious to those having ordinary skill in the art. Accordingly, in this example, the terms "Sync signal" and "blanking signal" are used interchangeably to represent the blanking signal time period. Note that other sources of Sync signal may be available in alternative applications. For example, it may be available from the green video signal. Then, the Auto Zero block 130 generates four pulsed signals, i.e., AZ 513, BAA 533, sin 529, (as shown in FIG. 3), and CLP 408, (as shown in FIG. 2), during the Sync signal time period to turn ON the three portions of the Auto-Zero functions in the ADC 112 as will be discussed below. Then, the pulsed signals will sequentially turn OFF the Auto Zero functions in order, as follows. First, turn OFF CLP 408, and then turn OFF sin 529, and then BAA 533, and lastly turn OFF AZ 513. The pulsed signal durations are designed to be within the Sync signal period. The sequence for turning OFF Auto Zeroing, i.e., returning the ADC 112 to normal operation, is selected to allow the ADC 112 circuits to be ready to capture analog signal input as accurately as possible.

In the first step inside the LCD monitor, the analog subsystem, including the DPLL 108 under control of the controller 110 operating from instruction stored in memory 111, attempts to detect the video mode of the graphics IC providing the video signal out of the PC. Based on the detected mode, the digital phase lock loop is programmed to generate a certain number of pixel clocks per horizontal sync. The analog to digital converters (ADC) 112 then produce digital outputs, using this reconstructed sampling clock signal 116.

According to a preferred embodiment of the present invention, the ADC 112 and the DPLL 108, the controller 110, and the memory 111, can all be located in one ASIC chip. Alternatively, the ADC 112 could be external and the controller 110 and memory 111 could be located internal to an ASIC chip. In a further alternative, the entire circuit can comprise electrically coupled circuit components that are not located in any particular ASIC chip.

As described in detail in U.S. patent application Ser. No. 09/534,932 and in U.S. patent application Ser. No. 09/535,049, the DPLL 108 includes a controllable digital frequency synthesizer. The controller 110 can couple a thirty two bit number to the DPLL 108 to generate a high precision frequency signal at the clock output 116. This digital frequency synthesizer sub-system, according to a preferred embodiment of the present invention, takes a 32 bit fixed precision number and generates a 50% duty cycle clock at a precise frequency for driving the ADC 112.

Figure 4A:
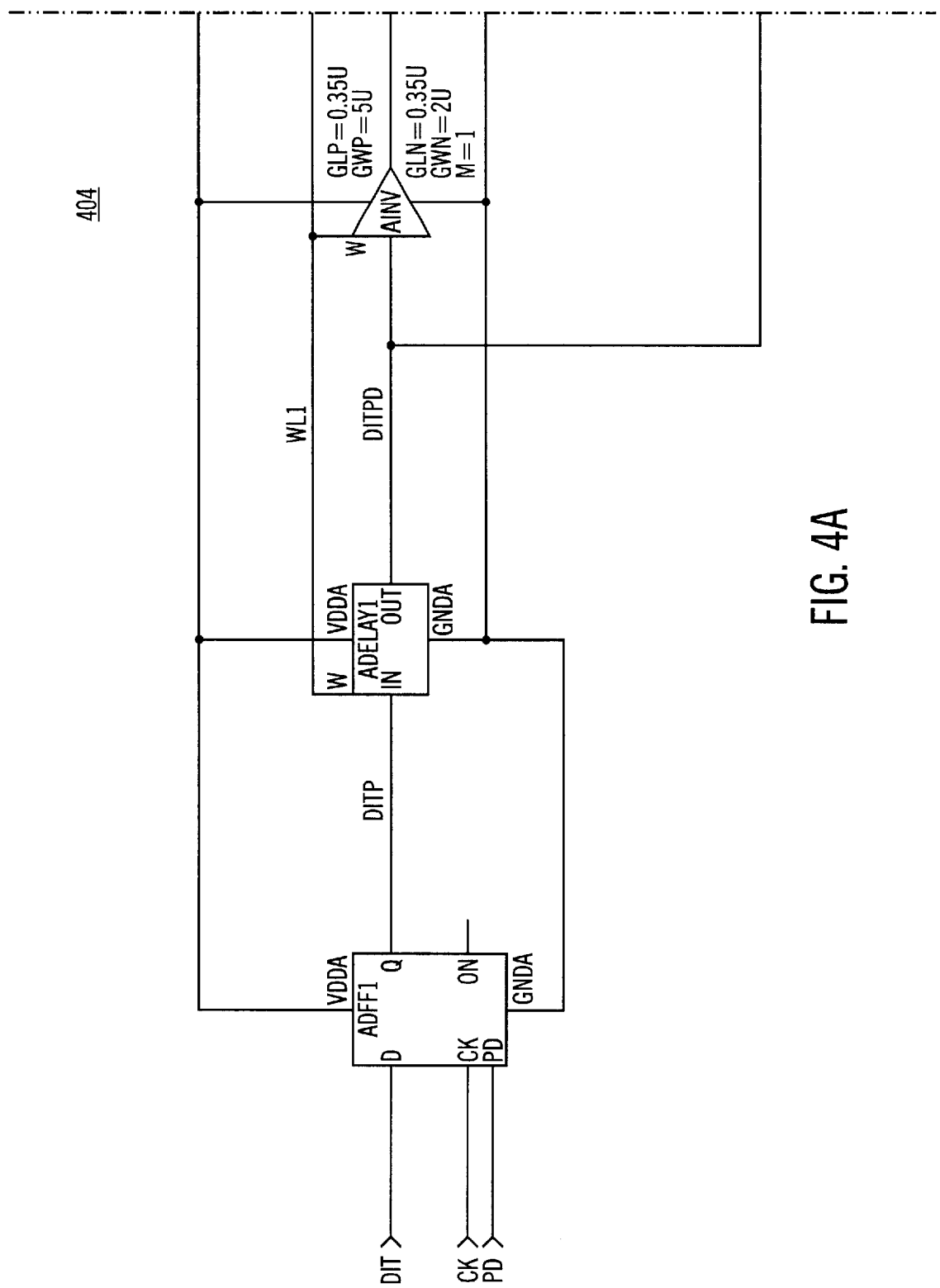
Figure 4B:
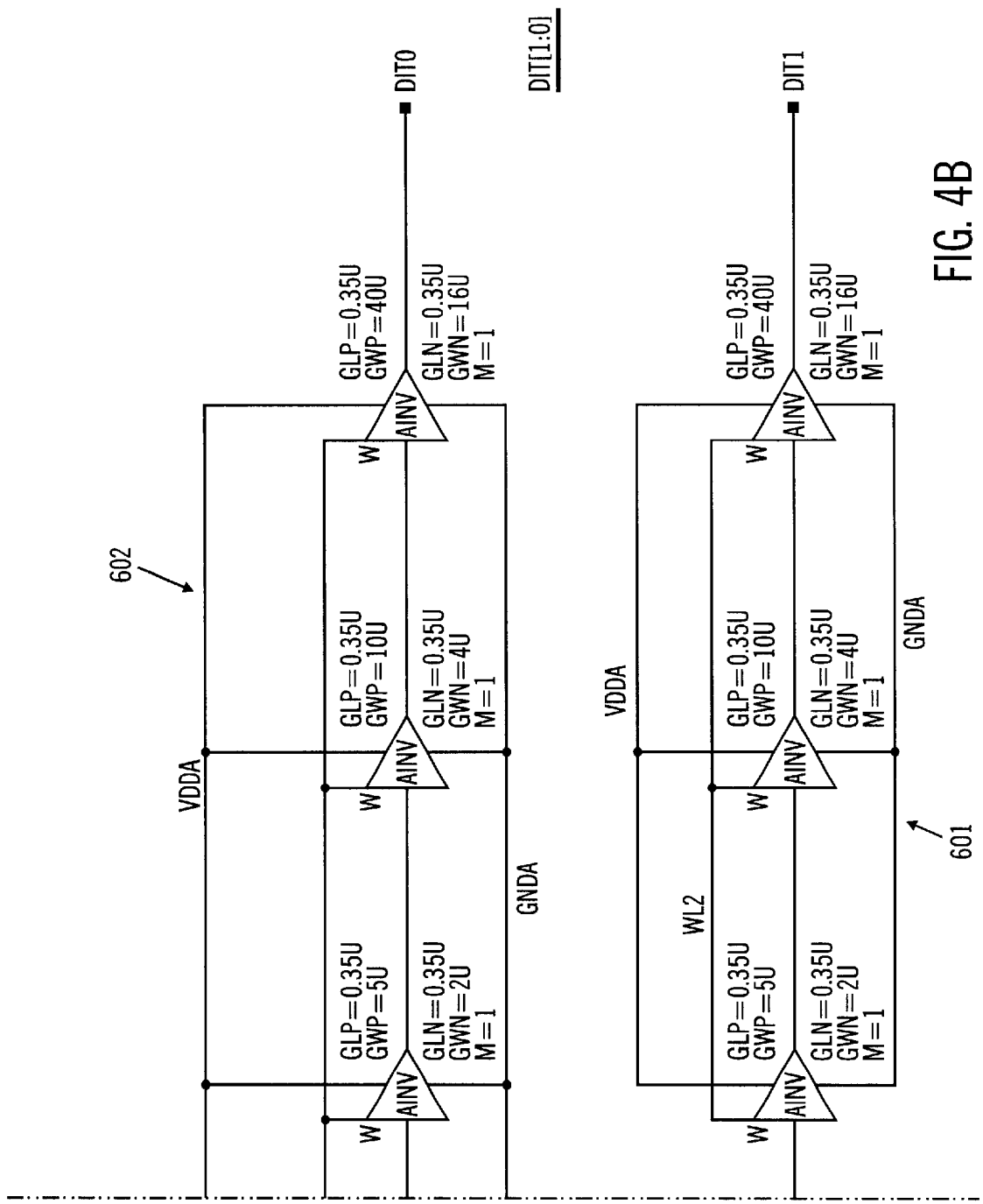

FIGS. 2, 3, and 4, illustrate new and novel circuits functioning in the ADC 112 for sampling a high speed electronic signal and converting the signal to a digital representation thereof. In particular, the new and novel ADC 112 solves the problems with the prior art and provides a cost effective and reliable solution for sampling high speed electronic signals such as video signals to create digital representations thereof. A number of features and advantages of the new and novel ADC 112 will be discussed below.

1. Auto-zero the ADC During the Horizontal Video Blanking Interval

Definition

During a special auto-zero time interval certain dedicated electronic switches store the offset voltages of the comparators of the ADC 112 on coupling capacitors in the signal path. During normal operation of the ADC 112 the offset voltages are subtracted from the signals, and the comparators behave as though they were offset-free. According to the preferred embodiments of the present invention, the circuits of the ADC 112 are designed to make this auto-zero time interval occur during the horizontal video blanking time of a video signal being converted by the ADC 112.

According to a preferred embodiment of the present invention, the auto-zero control signals are generated in Auto Zero block 130. The Auto Zero circuit block 130 is responsive to the blanking signal preferably by using the Sync signal in input 104, or alternatively from the video signal such as the green channel, and generates four Auto-Zero pulse signals AZ 513, BAA 533, sin 529, (as shown in FIG. 3), and CLP 408, (as shown in FIG. 2), during the blanking period. These signals, according to a preferred embodiment of the present invention, turn ON and sequentially turn OFF three circuit portions of the Auto-Zero functions in the ADC 112. The three portions of the ADC 112 to be Auto-Zeroed are Pre-amplifiers 502, 504, 506, Post-amplifiers 508, 510, 512, and the AIN 531. Specific Auto-Zero functions for each portion will be discussed below.

Some of the Advantages

A1). In general, auto-zeroing the comparators allows the use of much smaller transistors than would otherwise be necessary for. reducing the offsets below one LSB of the new and novel ADC 112, where one LSB, in this example, is equal to 700 mV/256~3 mV.

A2). Preferably, the ADC 112 performs the Auto-Zero function only once per video line during the horizontal blanking time interval instead of, as has been customary, during part of each clock cycle. This feature of the ADC 112 approximately doubles the sampling speed of the ADC 112 at a given power dissipation over a conventional ADC because all of the clock cycle is available for the analog signal processing. This auto-zeroing during the horizontal blanking is a significant advantage of the present invention that is not available in conventional ADCs. In conventional ADCs, which utilize per-cycle auto-zeroing function, only about half of the clock cycle is available for input signal processing by the conventional ADC circuits, the other portion of the clock cycle being taken up by the auto-zeroing function time.

In addition, since the once per line Auto-Zero time is much longer (e.g., 16 to 64 times longer) than conventional one-half clock cycle auto-zeroing time intervals, the auto-zero switches according to the present invention can be much smaller, thereby presenting less parasitic load on sensitive signal nodes in the ADC 112 circuits. This again is a significant advantage of the present invention.

2. Dithered Least Significant Bit (LSB) of ADC Output

Definition

The least significant bit of the new and novel ADC 112 is not generated by dedicated hardware decision levels (comparators). Instead all decision levels are shifted up and down by one LSB on successive cycles, by switching between 2 sets of reference voltages provided to the comparators of the ADC 112. The display and the human eye are relied upon to average out,the alternating outputs. For example, a one LSB dithered (predefined resolution of 7-bit) output signal can appear to a human eye as a virtual 8-bit resolution for stationary input signals.

Some of the Advantages

A1). The input load of the new and novel ADC 112 is cut in half over a conventional parallel ADC implementation because dithering one LSB bit can reduce by one the number of bits of hardware output resolution and thereby reduces the number of comparators in half as compared to a conventional parallel ADC implementation.

A2). The speed of the ADC 112 at a given power dissipation can be increased because the power is spread over half as many comparators as would otherwise be necessary. Dithering at higher speeds is an important advantage of the present invention where the ADC 112 is especially: designed for high speed signals such as video signals.

3. Two Levels of 2× Interpolation in the ADC

Definition

For greatest possible speed, the new and novel ADC 112 uses a parallel architecture with (approximately) 128 parallel comparators. However, there are only~32 analog input (pre amplifier) stages and 64 analog post amplifier stages. Between adjacent preamplifier stages the output signals are interpolated to drive twice as many post-amplifier stages, and then at the outputs of the post-amplifiers the output signals are interpolated once more to drive twice as many comparator latches. Advantageously, the two levels of interpolation are achieved by suitable wired interconnection arrangement only, and without needing any extra passive or active elements for the interconnections.

Some of the Advantages

A1). Compared to a conventional parallel (flash) ADC, the new and novel ADC 112 according to the present invention comprises only~¼ as many input stages. This greatly reduces the input load and allows driving the ADC 112 directly from a 75-Ohm video line, without requiring a buffer amplifier as in the past conventional video signal digital conversion systems.

A2). The reduced number of input and post amplifier stages means each stage can get a greater share of a given power dissipation, allowing the ADC to run faster than would be possible with a conventional all-parallel ADC design. This higher speed is particularly important for the ADC 112, according to the present invention, because it is particularly suited for digital conversion of high speed signals, such as video signals. It is a significant advantage of the present invention.

A3) Interpolating with wired only interconnect means no additional circuit elements, whether passive or active, with additional matching requirements are needed. This is an important feature of the new and novel ADC 112 by simplifying the circuit and thereby increasing the quality while reducing the cost of manufacturing.

A4). Interpolating with wired only interconnect means that there is no timing difference between direct output and interpolated stages following a given stage. This is especially important for sampling high speed signals, such as video signals, by the ADC 112. This wired only interconnect interpolation is a significant advantage of the present invention.

With particular reference to FIGS. 2, 3, and 4, a discussion of the new and novel circuits functioning in the ADC 112 follows. In accordance with the preferred embodiments of the present invention, the ADC 112 is particularly suited for digital conversion of high speed signals, such as for video signals. In view of the discussion of the main features and advantages of the new and novel ADC 112, specific circuit blocks will be discussed below.

With reference to FIG. 2, a bias circuit 411 supplies bias voltage for a current source in the aarr block 402 (an analog front end for the ADC 112), as will be discussed below. An nmos transistor 407 operates as a switch. When auto-zero control signal CLP 408 is high during blanking period, according to a preferred embodiment of the present invention, the switch 407 is turned ON and the input AIN 531 in aarr block 402 is charged or discharged to a pre-defined offset voltage.

A digital decoder block 409 decodes a 4 bit binary code into 16 lines and then selects 16 different reference voltages for circuit switch 407 to connect to the AIN (analog input) into the aarr block 402 for auto-zero functions. A dit_buf block (dithering buffer block) 404 takes a DIT signal 403 (dithering enable signal) as input and synchronizes the DIT signal 403 with the clock. The dit_buf block 404 then outputs positive and opposite phases signals for input into the aarr block 402 to control a dithering function. The DIT signal 403 is generated in digital logic controlling the ADC 112. The DIT signal 403 could be programmed to be: (1) Half of the clock frequency, (2) Every other horizontal line, or (3) Every other display picture.

An Encoder 406 receives the digital signal output lines from the latches in the aarr block 402, which are arranged in a 128 bit thermometer style output, and encodes the 128 bits of digital signal with the underflow signal into an 8-bit digital output. The ADC 112 provides this 8-bit digital output as a digital representation of the sampled analog signal at an analog input (AIN) to the ADC 112.

A clock buffer block 405 provides a clock signal to the aarr block 402. The clock buffer block 405 can be programmed to have strong or weak driving strength.

Random logic 413, as shown, generates a power down signal during a blanking period. The random logic 413 makes sure that the circuits in the ADC 112 are all in a known state and that they stay away from oscillation, noise coupling, and excessive Icc current consumption. Additionally, a digital inverter 401 is used to provide an inverted auto-zeroing enable signal into the aarr block 402.

With reference to FIG. 3, a more detailed circuit block diagram of the aarr block 402 is shown, according to a preferred embodiment of the present invention. The aarr block 402 provides an analog front end for the ADC 112. An analog input signal, from the AIN line 531, flows through Pre-amplifiers 502, 504 and 506, to Post-amplifiers 508, 510, and 512. Then, latch circuits 514, 517, 519, 521, 523, 525, and 527 convert the analog input signal from Post-amplifiers 508, 510, and 512, to digital output signals at the outputs of the latch circuits 514, 517, 519, 521, 523, 525, and 527.

There are a number of control signals in the aarr 402 will be discussed below. A dithering function is handled by alternating between two reference voltages provided by inputs 509, 511, to the Pre-amplifiers 502, 504 and 506. A low reference input 509 provides 1 LSB level lower than hi reference input 511 for the dithering function. The hi reference input 511 provides the other one of the two voltage references to the Pre-amplifiers 502, 504 and 506, for dithering function. A reference voltage input 501 provides a main voltage reference input for the aarr block 402. A dithering switch signal 507 selects the alternative reference voltages supplied at the pre-amplifiers 502, 504, and 506, at the hi input 511 and by the low input 509.

An auto Zero Control signal 513 and an inverted auto Zero Control signal 515 select the auto-zeroing function at the aarr 402. A sampling clock input 505 drives the clock signal for the latch circuits 514, 517, 519, 521, 523, 525, and 527. A select input switch signal 529 controls the analog input. 531 to the aarr 402. Lastly, a balance signal 533 controls the Pre-amplifiers 502, 504 and 506, as will be discussed below.

A summary of the circuit blocks in the aarr 402 is discussed below.
Circuit Blocks
503: Resistor Ladder
Divide the input reference voltage to 68 stages (include the 1 LSB dithering levels)
502, 504, 506: Pre-amplifiers
Differential amplifiers have the following function:
A: Auto-Zero function: Reset the output to same potential level during blanking period (Controlled by sin 529 and BAA 533)
B: Selectable input voltage reference level for dithering (Controlled by SR 507 to select between voltage reference inputs 509, and 511)
508, 510, 512: Post-amplifiers
Differential amplifiers have the following function:
A: Capacitor coupling inputs
B: Auto Zero function: charge or discharge the input capacitors and reset the outputs during blanking period. (Controlled by AZ 513, and AZB 515)
525,521,517,519,523,527,514: Latches
Differential latches that sample the converted analog signal as a thermometer style digital signal.
A summary of the functions of the circuit blocks is discussed below.
Detailed Circuit Description
The pre-amplifier 502, post-amplifier 508, and latch 525 generate an overflow signal. Similarly, Pre-amplifier 506, Post-amplifier 512, and Latch 527 generate an underflow signal, which is also the LSB of the 8 bit resolution of the ADC output. Additionally, in this exemplary ADC 112 configuration, there are a total 32 Pre-amplifiers for circuit block 504, 64 Post-amplifiers for circuit block 510, and 32 Latches for each circuit block 517, 519, 521, and 523. All of these blocks generate 128 thermometer code type digital output signals corresponding to the input analog signal level.
Interpolation Unlike most conventional ADC designs that have used comparators, this new and novel ADC 112 is using a 4-2-1 circuit structure with wired interconnect to reduce the overall circuit complexity and silicon area. This simplification increases quality and reduces the overall cost of the manufactured ADC 112, which is a significant advantage of the present invention. There are 128 thermometer code outputs for a 7 bit resolution in this exemplary configuration for the aarr block 402. Therefore, 128 Latches, 64 Post-amplifiers and 32 Pre-amplifiers are used in this circuit. This ADC 112 interpolates by using differential signals, as shown in FIG. 3. For example, the first 4 bits of 128 thermometer code are generated according to the following discussion.
For Latches Differential Latches 523 inputs IN+ and IN− are directly connected to the OUT− and OUT+ of the $2^{nd}$ Differential Post-amplifier of 510, which generate bit0. Differential Latches 519 inputs IN+ and IN− are connected to OUT− of the $_2$nd Differential Post-amplifiers 510 and OUT+ of the $1^{st}$ Differential Post-amplifiers of 510, which generate bit1. Differential Latches 517 inputs IN+ and IN− are directly connected to the OUT− and OUT+ of the $1^{st}$ Differential Post-amplifier of 510, which generate bit2. Differential Latches 521 inputs IN+ and IN− are connected to OUT− of the $1^{st}$ Differential Post-amplifiers 510 and OUT+ of the $2^{nd}$ Differential Post-amplifiers of 510, which generate bit3.
For Post-amplifiers:

The IN+ of the two Differential Post-amplifiers in 510 are connected to OUT− of Pre-amplifier 504. The IN− of the $1^{st}$ Differential Post-amplifier in 510 is connected to OUT+ of Pre-amplifier 502 and the IN− of the $2^{nd}$ Differential Post-amplifier in 510 is connected to OUT+ of Pre-amplifier 504.
Dithering Dithering is realized by alternating sets of input voltage reference level into the Pre-amplifier blocks 502, 504, and 506, typically alternating every other clock cycle (or it can be alternated every other line, or every other frame). The difference of the two voltage reference levels, in this example, corresponds to 1 LSB of a 7 bit signal. Since the output of the ADC 112 is 8 bits and the LSB is always 1, by alternating the $2^{nd}$ LSB, an average output is developed, i.e., the ADC 112 can achieve effectively 7.5 bit resolution according to a preferred embodiment of the present invention.
Auto Zero Auto Zero mode, according to a preferred embodiment of the present invention, is activated during the blanking period. Auto Zero is defined as the charging or discharging, as necessary, the input coupling capacitors of the Post-amplifier 508, 510, and 512, to eliminate, or greatly reduce, the input offset voltage, and reset the outputs of the Post-amplifier 508, 510, and 512. Also, the Auto Zero function preferably resets the outputs of the Pre-amplifier 502, 504 and 506, to the same potential level for more precise amplification of the coming analog signal. Finally, the Auto Zero function will preferably charge or discharge the AIN 531 to a pre-defined offset voltage.

With reference to FIG. 4, a more detailed circuit block diagram of the dithering buffer block 404 is shown, according to a preferred embodiment of the present invention. A flip-flop 601 synchronizes the dithering enable input (DIT) 403 with the clock (CK) signal. There is a delay block that follows the output to gain timing for high frequency operation. Then, there are two inverter strings 602, 601, a total of 7 inverters in this example, to generate and buffer in and out phase DIT0 & DIT1 signals. The DIT0 & DIT1 signals 507 (see FIG. 3) are provided to the Pre-amplifiers 502, 504, and 506, for dithering the voltage references into the Pre-amplifiers 502, 504, and 506, as discussed above with respect to the dithering function of the ADC 112.

The present invention offers significant advantages over the prior art. In prior art systems, conventional ADCs were adequate for slower signal sampling rates. However, with new high speed digital signaling requirements, such as for video signaling systems, it requires a new and novel ADC 112, according to the present invention, which provides the necessary new circuit features and functions to process the high speed signals as discussed above. The new and novel ADC 112, as discussed above, provides significantly improved high speed performance for devices incorporating the present invention while increasing the quality and reducing the overall costs of manufacturing such devices.

Although specific embodiments of the invention have been disclosed, those having ordinary skill in the art will understand that changes can be made to the specific embodiments without departing from the spirit and scope of the invention. Additionally, many modifications may be made to adapt a particular situation to the teachings of the present invention without departing from the central inventive concepts described herein. Furthermore, an embodiment of the present invention may not include all of the features described above. The scope of the invention is not to be restricted, therefore, to the specific embodiments, and it is intended that the appended claims cover any and all such applications, modifications, and embodiments within the scope of the present invention.

What is claimed is:

1. An electronic signal sampling circuit comprising:
 a first input for receiving an electronic signal;
 a sampling clock input for receiving a sampling clock signal;
 an auto-zeroing circuit for providing an auto-zeroing signal during a horizontal blanking time period corresponding to the electronic signal; and
 a sampling circuit, electrically coupled to the first input and to the sampling clock input and responsive to the sampling clock signal, for sampling the electronic signal to convert the sampled electronic signal to digital representations thereof at occurrences of the sampling clock signal and provide the digital representations as output signals of the sampling circuit, the sampling circuit being electrically coupled to the auto-zeroing circuit for auto-zeroing the sampling circuit during the horizontal blanking time period corresponding to the electronic signal.

2. The electronic signal sampling circuit of claim 1, wherein the output signals comprise a predefined resolution, and the electronic signal sampling circuit further comprising a bit dithering circuit electrically coupled to the sampling circuit for increasing the predefined resolution of the output signals provided by the sampling circuit.

3. The electronic signal sampling circuit of claim 2, wherein the bit dithering circuit increases the resolution of the output signals provided by the sampling circuit by bit dithering a least significant bit of the output signals provided by the sampling circuit.

4. The electronic signal sampling circuit of claim 2, wherein the sampling circuit comprises comparator circuits for comparing the electronic signal to a set of reference voltages for sampling the electronic signal to convert the sampled electronic signal to digital representations thereof, and wherein the bit dithering circuit increases the predefined resolution of the output signals provided by the sampling circuit by selectively providing first and second sets of reference voltages in alternating fashion to the comparator circuits to increase the predefined resolution of the output signals provided by the sampling circuit.

5. The electronic signal sampling circuit of claim 1, wherein the sampling circuit comprises at least one comparator for comparing the electronic signal to a set of at least one reference voltage to convert the sampled electronic signal to digital representations thereof, and the electronic signal sampling circuit further comprising a plurality of latching circuits, electrically coupled to the sampling clock input and responsive to the sampling clock signal, for capturing the sampled electronic signal at occurrences of the sampling clock signal to provide the digital representations of the electronic signal as output signals of the plurality of latching circuits, the plurality of latching circuits being electrically coupled to the at least one comparator circuit via wired interconnect interpolation, and the number of latching circuits in the plurality of latching circuits being greater than the number of comparators in the at least one comparator.

6. A video analog-to-digital converter comprising:
 a first input for receiving an electronic signal;
 a sampling clock input for receiving a sampling clock signal;
 an auto-zeroing circuit for providing an auto-zeroing signal during a horizontal blanking time period corresponding to the electronic signal; and
 a sampling circuit, electrically coupled to the first input and to the sampling clock input and responsive to the sampling clock signal, for sampling the electronic signal to convert the sampled electronic signal to digital representations thereof at occurrences of the sampling clock signal and provide the digital representations as output signals of the sampling circuit, the sampling circuit being electrically coupled to the auto-zeroing circuit for auto-zeroing the sampling circuit during the horizontal blanking time period corresponding to the electronic signal.

7. The video analog-to-digital converter according to claim 6, wherein the output signals comprise a predefined resolution, and the video analog-to-digital converter further comprising a bit dithering circuit electrically coupled to the sampling circuit for increasing the predefined resolution of the output signals provided by the sampling circuit.

8. The video analog-to-digital converter according to claim 7, wherein the bit dithering circuit increases the resolution of the output signals provided by the sampling circuit by bit dithering a least significant bit of the output signals provided by the sampling circuit.

9. The video analog-to-digital converter according to claim 7, wherein the sampling circuit comprises comparator circuits for comparing the electronic signal to a set of reference voltages for sampling the electronic signal to convert the sampled electronic signal to digital representations thereof, and wherein the bit dithering circuit increases the predefined resolution of the output signals provided by the sampling circuit by selectively providing first and second sets of reference voltages in alternating fashion to the comparator circuits to increase the predefined resolution of the output signals provided by the sampling circuit.

10. The video analog-to-digital converter according to claim 6, wherein the sampling circuit comprises at least one comparator for comparing the electronic signal to a set of at least one reference voltage to convert the sampled electronic signal to digital representations thereof, and the video analog-to-digital converter further comprising a plurality of latching circuits, electrically coupled to the sampling clock input and responsive to the sampling clock signal, for capturing the sampled electronic signal at occurrences of the sampling clock signal to provide the digital representations of the electronic signal as output signals of the plurality of latching circuits, the plurality of latching circuits being electrically coupled to the at least one comparator circuit via wired interconnect interpolation, and the number of latching circuits in the plurality of latching circuits being greater than the number of comparators in the at least one comparator.

11. The video analog-to-digital converter according to claim 6, wherein the auto-zeroing circuit comprising at least one transistor switch electrically coupled to the sampling circuit for auto-zeroing the sampling circuit during a horizontal blanking time period corresponding to the electronic signal by transferring bias voltage across the at least one transistor switch, the transistor switch being smaller than a transistor switch necessary for auto-zeroing the sampling circuit during a portion of the cycle of the sampling clock signal.

12. A video display monitor system comprising:

a video display monitor;

a video interface comprising an electronic signal;

a clock source for providing a sampling clock signal; and an analog-to-digital converter, electrically coupled to the video interface for receiving the electronic signal therefrom, electrically coupled to the clock source for receiving the sampling clock signal, and electrically coupled to the video display monitor for providing thereto digital representations, of samples of the electronic signal, the analog-to-digital converter comprising:

a first input, electrically coupled to the video interface, for receiving the electronic signal;

a sampling clock input for receiving the sampling clock signal from the clock source;

an auto-zeroing circuit for providing an auto-zeroing signal during a horizontal blanking time period corresponding to the electronic signal; and a sampling circuit, electrically coupled to the first input and to the sampling clock input and responsive to the sampling clock signal, for sampling the electronic signal to convert the sampled electronic signal to digital representations thereof at occurrences of the sampling clock signal and for providing the digital representations as output signals from the sampling circuit to the video display monitor, the sampling circuit being electrically coupled to the auto-zeroing circuit for auto-zeroing the sampling circuit during the horizontal blanking time period corresponding to the electronic signal.

13. The video display monitor system as defined in claim 12, wherein the output signals comprise a predefined resolution, and the video display monitor system further comprising a bit dithering circuit electrically coupled to the sampling circuit for increasing the predefined resolution of the output signals provided by the sampling circuit.

14. The video display monitor system as defined in claim 13, wherein the bit dithering circuit increases the resolution of the output signals provided by the sampling circuit by bit dithering a least significant bit of the output signals provided by the sampling circuit.

15. The video display monitor system as defined in claim 13, wherein the sampling circuit comprises comparator circuits for comparing the electronic signal to a set of reference voltages for sampling the electronic signal to convert the sampled electronic signal to digital representations thereof, and wherein the bit dithering circuit increases the predefined resolution of the output signals provided by the sampling circuit by selectively providing first and second sets of reference voltages in alternating fashion to the comparator circuits to increase the predefined resolution of the output signals provided by the sampling circuit.

16. The video display monitor system as defined in claim 12, wherein the sampling circuit comprises at least one comparator for comparing the electronic signal to a set of at least one reference voltage to convert the sampled electronic signal to digital representations thereof, and the analog-to-digital converter further comprising a plurality of latching circuits, electrically coupled to the sampling clock input and responsive to the sampling clock signal, for capturing the sampled electronic signal at occurrences of the sampling clock signal to provide the digital representations of the electronic signal as output signals of the plurality of latching circuits, the plurality of latching circuits being electrically coupled to the at least one comparator circuit via wired interconnect interpolation, and the number of latching circuits in the plurality of latching circuits being greater than the number of comparators in the at least one comparator.

17. The video display monitor system as defined in claim 12, wherein the video display monitor comprises an LCD flat panel monitor.

18. The video display monitor system as defined in claim 12, wherein the clock source comprises a digital phase lock loop.

19. The video display monitor system as defined in claim 12, wherein the auto-zeroing circuit comprising at least one transistor switch electrically coupled to the sampling circuit for auto-zeroing the sampling circuit during a horizontal blanking time period corresponding to the electronic signal by transferring bias voltage across the at least one transistor switch, the transistor switch being smaller than a transistor switch necessary for auto-zeroing the sampling circuit during a portion of the cycle of the sampling clock signal.

* * * * *